United States Patent [19]

Greiner

[11] 4,335,596

[45] Jun. 22, 1982

[54] DEVICE FOR MEASURING THE OPERATION OF A TIMEPIECE MOVEMENT

[75] Inventor: Yvan Greiner, La Chaux-de-Fonds, Switzerland

[73] Assignee: Portescap, La Chaux-de-Fonds, Switzerland

[21] Appl. No.: 89,355

[22] Filed: Oct. 30, 1979

[30] Foreign Application Priority Data

Oct. 30, 1978 [CH] Switzerland ............. 11170/78

[51] Int. Cl.³ .................. G04B 17/00; G04D 5/00
[52] U.S. Cl. ............................. 73/6; 368/327
[58] Field of Search .................. 33/6; 368/27

[56] References Cited

U.S. PATENT DOCUMENTS

| | | | |
|---|---|---|---|
| 3,370,456 | 2/1968 | Jucker | 73/6 |
| 3,407,645 | 10/1968 | Jucker et al. | 73/6 |
| 3,817,083 | 6/1974 | Jucker | 73/6 |
| 3,939,689 | 2/1976 | Desarzens | 73/6 |
| 3,946,592 | 3/1976 | Ichikawa et al. | 73/6 |
| 4,028,927 | 6/1977 | Kikuyama et al. | 73/6 |

Primary Examiner—Daniel M. Yasich
Attorney, Agent, or Firm—Cushman, Darby & Cushman

[57] ABSTRACT

A device for measuring a characteristic magnitude of the operation of a timepiece movement is disclosed, in which measuring pulses are generated in response to vibrations of the movement for measuring the time intervals between vibrations reflecting the operation of the movement. The generation of measuring pulses is allowed only within a short window of constant duration following a blocking period which starts after the occurrence of a measuring pulse and has a duration depending on the duration of the penultimate preceding time interval between measuring pulses.

3 Claims, 14 Drawing Figures

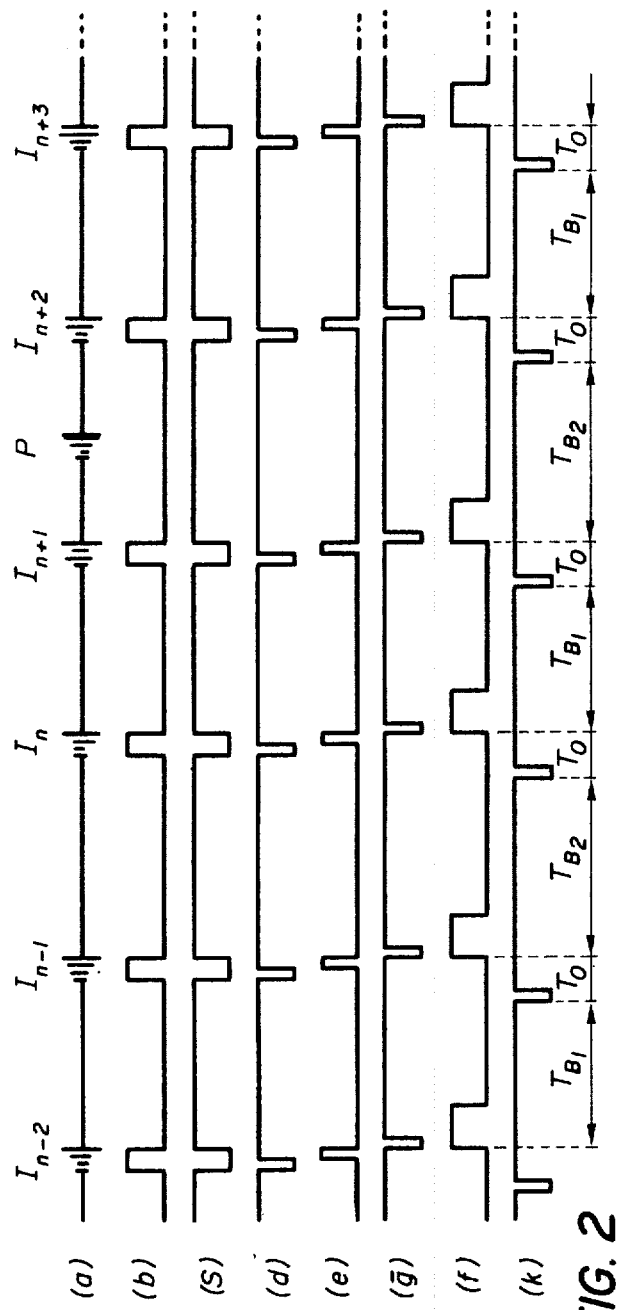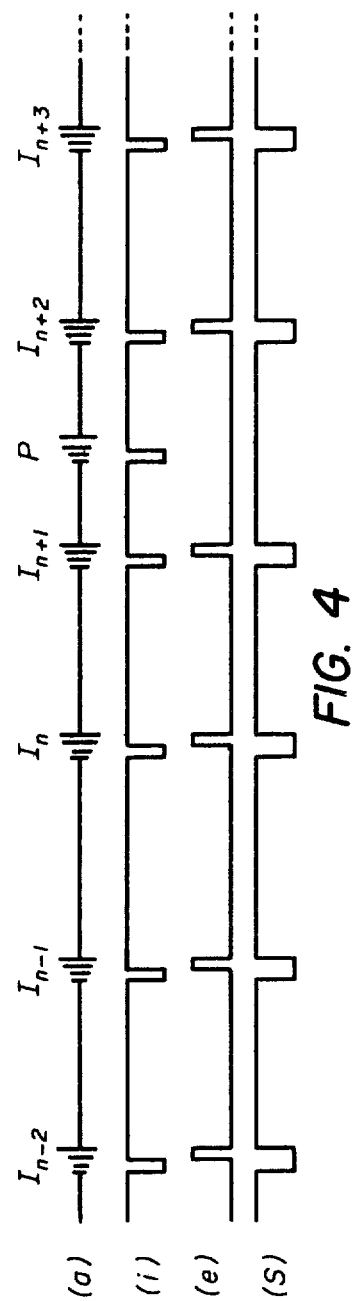
FIG. 2
FIG. 4 ns per hour or a period of a duration of 200 milliseconds, the shortest time interval between two consecutive useful measuring pulses may be 90 milliseconds and the longest time interval can be 110 milliseconds. In this case the maximum value of the blocking period is in practice limited to 80 milliseconds, which means that the window is 10 milliseconds for the short interval and 30 milliseconds for the long interval. For an oscillation frequency corresponding to 18,000 half periods per hour or a period of 400 milliseconds, practical values are for instance the following: Duration of the short interval 190 milliseconds, duration of the long interval 210 milliseconds, blocking period 80 milliseconds, duration of the window in the short interval 110 milliseconds, duration of the window in the long interval 130 milliseconds.

DEVICE FOR MEASURING THE OPERATION OF A TIMEPIECE MOVEMENT

BACKGROUND OF THE INVENTION

This invention relates to the measuring of a characteristic magnitude of the operation of a timepiece movement and, more particularly, to a device for measuring said magnitude by detecting the mechanical vibrations produced in the operation of said movement.

The characteristic magnitudes of the operation of a timepiece movement are for instance the time error, the dissymmetry of the half-oscillations of the balance or the amplitude of oscillation of the balance. For measuring those magnitudes the vibration produced by the operation of the timepiece movement, in particular, in the case of a balance-wheel watch, the vibrations produced by the operation of the escapement, are detected and converted into electric pulses and those measuring pulses are compared with a periodic reference signal or clock pulse of a known constant frequency. A device of this type is for instance described in Swiss Pat. No. 556 573 which corresponds to U.S. Pat. No. 3,817,083.

Measuring errors can be produced in such a device by undesired vibrations or noise signals which generally occur at irregular intervals between the periodic pulses of the operation of the timepiece. Those interfering pulses can produce measuring pulses which are not related to the characteristic magnitude of the timepiece to be measured.

It is already known to prevent the generation of measuring pulses by interfering noise pulses, by blocking the generation of measuring pulses during a part of the time interval between two consecutive normal pulses produced by the timepiece movement, which blocking interval starts immediately after each measuring pulse and ends soon enough to allow the generation of a measuring pulse by the following vibration due to the normal operation of the watch movement.

In other words, each time interval between two consecutive useful pulses produced by the watch movement comprises a blocking period during which the generation of measuring pulses is prevented, and a window during which vibrations detected by the device will generate a measuring pulse. To reduce in as far as possible the generation of a measuring pulse by an interfering pulse, the duration of the blocking period should be as close as possible to the duration of the time interval between two consecutive useful measuring pulses, and therefore the said window should be open only at the expected time of arrival of a useful measuring pulse.

However, prior to the invention, it has not been possible to increase the ratio between the blocking period and the time interval between two consecutive useful measuring pulses above a relatively low limit and, consequently, to reduce the window below a relatively large part of the said interval. This is due to the fact that the said time interval between two consecutive useful measuring pulses is not known very precisely, at least before it has been measured, and therefore the duration of the window must be sufficiently long to make sure that the expected measuring pulse will fall within said window. In particular, when measuring the half-period of the oscillation of a balance-wheel or other dissymmetric time intervals, the blocking period must be limited as far as necessary for measuring the shorter time interval. For instance, for a watch movement with an oscillation frequency corresponding to 36,000 half-peri- Therefore, the risk of a generation of a measuring pulse by interfering noise remains important in spite of the presence of a blocking period.

OBJECTS OF THE INVENTION

It is an object of the present invention to provide an improved device for measuring a characteristic magnitude of a timepiece movement, in which the above mentioned risk can be substantially reduced by providing means to reduce the width of the said window with respect to the known devices.

SUMMARY OF THE INVENTION

In accordance with the present invention, a device for measuring a characteristic magnitude of a timepiece movement include means for preventing the generation of measuring pulses during a blocking period, which means are adapted to start each blocking period immediately after the end of each measuring pulse and to provide blocking periods which are each equal to the duration of the penultimate time interval between measuring pulses preceding said blocking period, less a constant duration.

BRIEF DESCRIPTION OF THE DRAWINGS

The following detailed description, given by way of example, will best be understood in conjunction with the accompanying drawings in which

FIG. 2(a) is a wave-form chart showing the signal present at point (a) in the circuit of FIG. 1;

FIG. 2(b) is a wave-form chart showing the signal present at point (b) in the circuit of FIG. 1;

FIG. 2(s) is a wave-form chart showing the signal present at point (s) in the circuits of FIG. 1;

FIG. 2(d) is a wave-form chart showing the signal present at point (d) in the circuit of FIG. 1;

FIG. 2(e) is a wave-form chart showing the signal present at point (e) in the circuits of FIG. 1;

FIG. 2($\bar{g}$) is a wave-form chart showing the signal present at point ($\bar{g}$) in the circuit of FIG. 1;

FIG. 2(f) is a wave-form chart showing the signal present at point (f) in the circuit of FIG. 1; and FIG. 2(k) is a wave-form chart showing the signal present at point (k) in the circuit of FIG. 1.

FIG. 4(a) is a wave-form chart showing the signal present at point (a) in the circuit of FIG. 3;

FIG. 4(i) is a wave-form chart showing the signal present at point (i) in the circuit of FIG. 3;

FIG. 4(e) is a wave-form chart showing the signal present at point (e) in the circuit of FIG. 3; and FIG. 4(s) is a wave-form chart showing the signal present at point (s) in the circuit of FIG. 3.

DETAILED DESCRIPTION OF A PREFERRED EMBODIMENT

Figure 1:
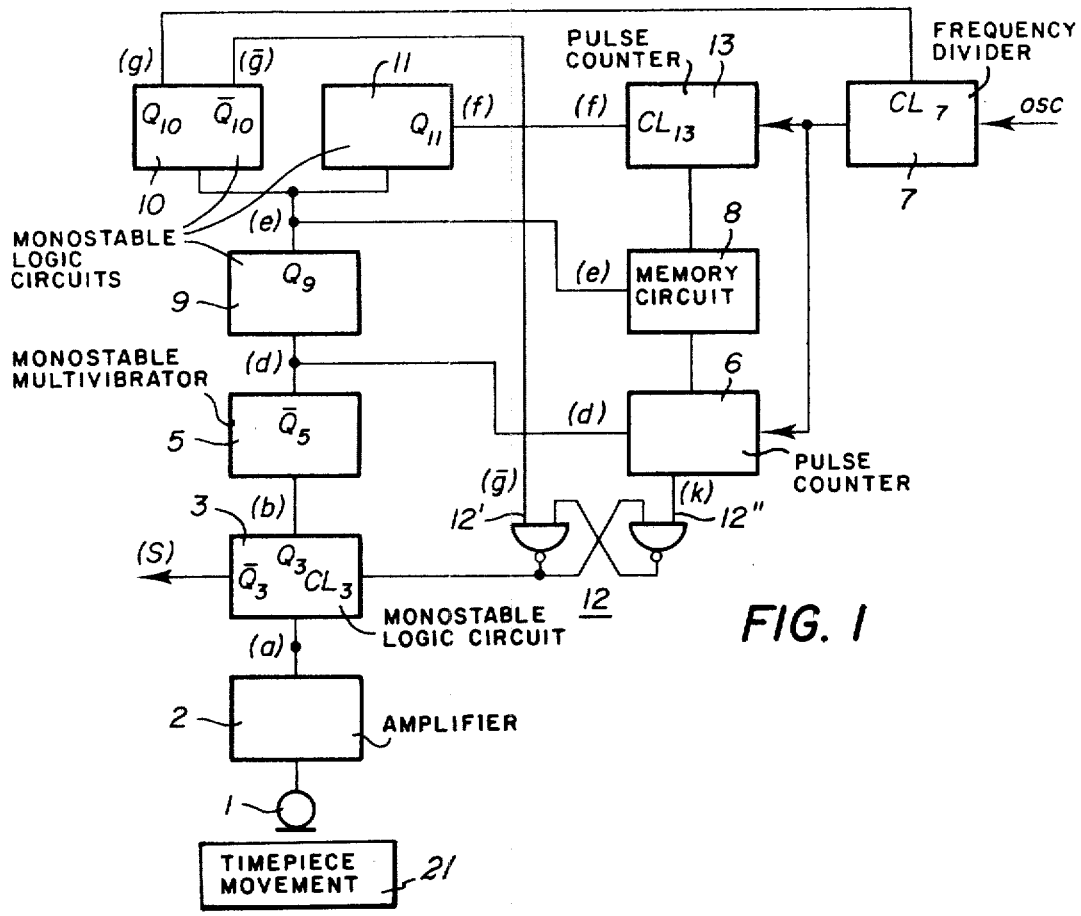
FIG. 1 is a block diagram of a measuring pulse generating device in accordance with the invention.

Referring now to FIG. 1 of the drawings, the block diagram of a device for generating measuring pulses in accordance with the invention shows a sensing device 1, for instance a microphone, capable of detecting the vibrations of a timepiece movement 21, for instance the sounds produced by the operation of the escapement but also other sounds or vibration interfering with the useful sounds produced by the current operation of the watch movement. The output of the sensing device 1 is amplified in an amplifier 2.

Therefore, at point (a) of the device appears a signal as illustrated schematically at line (a) of FIG. 2. Each vibration or sound is shown to be composed by a short group $I_n$ of individual vibrations, each such group being produced at the beginning of each half-period of the oscillation of the balance-wheel and representing the normal pulses produced by the operation of the escapement of a watch. However, other vibrations or sounds such as the one illustrated at P in FIG. 2, which are due to other external causes can be detected by the microphone and interfere with the normal pulses which occur at regular intervals. In the following description the regular pulses will be referred to as "tops" while the interfering perturbating pulses will be referred to as "noise pulses".

The signal appearing at point (a) of the circuit is applied to a monostable logic circuit 3, which can for instance be an integrated circuit type 74 LS 221 manufactured by Texas Instruments Company. The signal which appears at output $Q_3$ of circuit 3 is a signal (b) constituted by a series of square shaped pulses of short duration, for instance 4 microseconds, having a rising leading edge and a falling trailing edge and being synchronised with the tops as represented at FIG. 2. At an output terminal $\overline{Q}_3$ of circuit 3 appears a signal (S) formed of pulses which are inverted with respect to pulses (b). As will be seen, this signal (S) represents the measuring pulses generated by the present device. These measuring pulses are synchronized with the tops, each top producing one measuring pulse. However, a noise signal such as P is prevented from generating a measuring pulse by resetting circuit 3 to zero during nearly the whole period comprised between two consecutive tops, leaving only a short period of time for the production of the useful pulses (S) by circuit 3. This period or window is of constant duration, which can be made, in accordance with the invention, equal to about 0.1 to 2% of the whole interval between useful pulses. This is obtained by the operation of the device as described hereinafter.

Signal (b) is applied to the input of a monostable multivibrator circuit 5, formed for instance by another integrated circuit of type 74 LS 221. This provides an output signal (d) at output terminal $Q_5$ formed by a series of square-wave pulses of short duration, for instance 2 microseconds, having a rising leading edge and being synchronized with the tops of the watch movement.

Signal (d) is applied to a load terminal $L_6$ of a pulse counter 6 capable of counting down. This counter can be realized for example, by an integrated circuit type 74 LS 193 of Texas Instruments Company. Pulse counter 6 further receives a periodical electric signal or clock pulse formed by a train of square-wave pulses with a period of 1 millisecond, from a frequency divider 7 which is connected through a connection OSC to a pulse generator with constant repetition frequency, for instance a quartz oscillator (not shown). In the present embodiment counter 6 is negative-edge-triggered by the pulses applied from divider 7.

Signal (d) is further applied to the input of a monostable logic circuit 9, for instance again formed by an integrated circuit 74 LS 221, which provides an output signal (e) on output terminal $Q_9$. As shown in FIG. 2, this signal is formed by a series of square-wave pulses having a rising leading edge and a duration of about 2 microseconds. These pulses are synchronized with the watch tops but are shifted with respect to the (d)-signal pulses by a value equal to the duration of the (d)-signal pulses, i.e. for instance 2 microseconds.

Signal (e) is applied to a clock terminal of a memory circuit 8.

Signal (e) is further applied, simultaneously, to the input connection of a monostable logic circuit 10 and the input of a monostable logic circuit 11. Circuits 10 and 11 can be for instance formed by integrated circuits type 74 LS 221, as the previously mentioned monostable logic circuits or multivibrators.

Monostable circuit 10 provides an output signal (g) appearing on its output terminal $Q_{10}$ and an output signal (ḡ) which is the inverse of signal (g) and appears on output terminal $\overline{Q}_{10}$. Each of these signals is formed by a series of square-wave pulses of a duration of, for instance, 2 microseconds, pulses (g) having a falling leading edge. These pulses are also synchronized with the tops of the watch movement but are shifted with respect to the leading edge thereof by the duration of pulses (d) and (e), i.e. for instance 4 microseconds.

Signal (g) is applied to a clear input $CL_7$ of a frequency divider 7 allowing to reset the same to zero. Signal (ḡ) is applied to the input terminal 12' of a bistable logic circuit 12, the other input 12" of which is connected to the output of counter 6 providing an output signal (k).

Monostable circuit 11 provides an output signal (f) appearing on its output $Q_{11}$ and having the form of a series of square-wave pulses of a duration of about 2 milliseconds. The rising leading edges of pulses (f) are synchronized with respect to the tops of the watch movement and are shifted with respect thereto by the same amount as pulses (g) and (ḡ).

Signal (f) is applied to a clear-input $CL_{13}$ of a pulse counter 13 capable of counting up and being reset to zero by pulses (f). This counter can for instance be formed by an integrated circuit type 74 LS 393 made by Texas Instruments Company. Counter 13 counts the signal pulses or clock pulse provided by divider 7 and is negative-edge-triggered.

Memory circuit 8 is connected between the up-counting counter 13 and the down-counting counter 6. Each pulse of signal (f) maintains the counter 13 at zero for the duration of this pulse, i.e. for instance during 2 milliseconds.

Therefore, for each time interval comprised between two consecutive tops, i.e. in the case of balance-wheel watches for the duration of a half-period of oscillation of the balance, counter 13 registers a number of pulses corresponding to the total number of pulses delivered by divider 7 within this duration, less the number of pulses delivered by divider 7 during the reset-to-zero period of counter 13, i.e. 2 milliseconds in the present example.

Each signal pulse (g) results in the maintaining at zero of the frequency divider 7 for the duration of this pulse (2 microseconds), so that counter 13 starts counting in synchronism with each top of the watch, the delay of 4 microseconds being negligible with respect to the duration of the period of the signals from divider 7 which is 1 millisecond. Thus, maintaining the divider 7 at zero at each top eliminates the possibility of a counting error of one in the number of clock pulses counted by counter 13 between two consecutive tops, which would correspond to a measuring error of 1 millisecond.

Each pulse of signal (e) triggers the transfer into memory 8 of the count of counter 13.

Each pulse of signal (d) triggers the transfer into counter 6 of the status of memory 8.

Output signal (k) of counter 6 is formed by a series of square-wave pulses having for instance a duration of 1 millisecond and having a falling leading edge. Each of these pulses is produced when counter 6 comes to zero at the end of down-counting.

The output signal of the bistable circuit 12 is applied to the clear-terminal $CL_3$ of monostable circuit 3 to reset the same to zero. As a result, output signals (S) and (b) of this circuit are prevented from being delivered during the time interval comprised between the occurrence of a leading edge (falling) of pulses ($\bar{g}$) and the leading edge (falling) of the pulses of signal (k). This time interval or blocking period therefore starts 4 microseconds after the beginning of each top of the watch (for instance $I_n$) and its duration $T_{B1}$ is equal to the duration of counting of counter 13 during the time interval between two preceding tops (for instance $I_{n-2}$ and $I_{n-1}$).

The result of the counting of counter 13 during the time interval between two consecutive tops, for instance tops $I_{n-2}$ and $I_{n-1}$, corresponding to a half-period of oscillation of the balance, is entered into memory 8 during the following half-period, i.e. between tops $I_{n-1}$ and $I_n$, and returned to the down-counting counter 6 during the next following half-period, i.e. between tops $I_n$ and $I_{n+1}$, in order to define the blocking period $T_{B1}$ for this last half period. It will be seen that the duration of counting of counter 13 is equal to the duration of a half-period less a fixed duration $T_O$, which is of 2 milliseconds in the present example. The duration $T_O$ represents the width of the window during which a top or a noise pulse which might have been detected by the sensing device 1 can result in the generation of a measuring pulse (S).

The duration $T_O$ has a constant value even in the case in which consecutive time intervals to be measured are not of the same duration, for instance when an escapement is not in beat and results in dissymmetrical half-periods of oscillation of the balance-wheel with respect to its position of rest.

With respect to the blocking period $T_{B2}$ during the time interval between tops $I_{n+1}$ and $I_{n+2}$, it will be seen from FIG. 2 that this blocking period is longer than the blocking period $T_{B1}$. Again the blocking period is equal to the time interval between consecutive tops less the constant duration $T_O$.

The device according to the invention therefore provides a variable blocking period the duration of which depends on the duration of each interval between two consecutive tops, while the window within which the next useful top is expected has a constant duration $T_O$. This allows considerably reduction of the width of the said window with respect to the formerly used devices in which the blocking period was fixed and the window width variable.

For instance, in a device operating with the above mentioned internal pulse durations and in the current case of a watch movement with a oscillation frequency of 36,000 half-periods per hour and with a short half-period of 90 milliseconds and a long half-period of 110 milliseconds, similarly as shown in FIG. 2, the duration $T_O$ of the window has a constant value of 2 milliseconds. This corresponds to about 2.2% of the short half-period and 1.8% of the long half-period. For comparison, the usual values mentioned before are 10 milliseconds or 11% for the short half-period and 30 milliseconds or 27% for the long half-period.

The present device can further include means for verifying the synchronization of the various pulse signals with the tops of the timepiece movement and for automatically reestablishing the synchronization of the measuring pulses if necessary.

Figure 3:
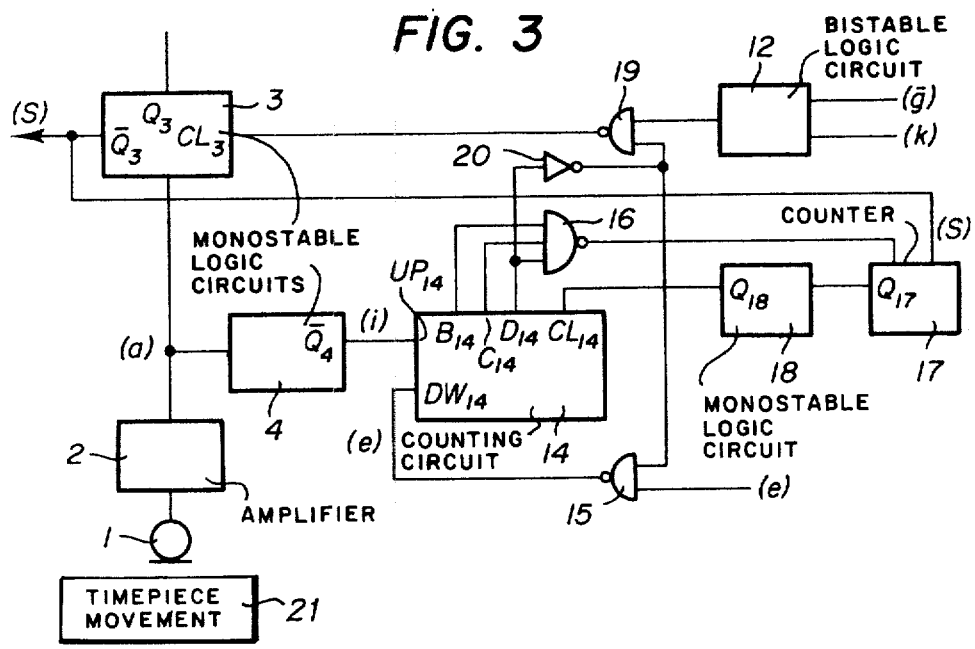
FIG. 3 is a block diagram of a circuit to automatically achieve synchronism between the measuring pulses and the vibrations of a watch movement.

FIG. 3 is a block diagramm of a corresponding circuit.

The circuit shown in FIG. 3 comprises a monostable logic circuit 4 which can be realised for instance by an integrated circuit of type 74 LS 221. When the aforementioned signal (a) is applied to the input of this logic circuit, the output terminal $\bar{Q}_4$ of this circuit delivers a signal (i) shown in the corresponding line of FIG. 4. As will be seen, signal (i) is formed by square-wave pulses of very short duration, for instance 1 microsecond, having a falling leading edge and being synchronized with the tops of the watch movement.

Signal (i) is applied to input $UP_{14}$ of a counting circuit 14 capable of counting up and down, which counting circuit can be realised by an integrated circuit type 74 LS 192 made by Texas Instruments Company. Another input terminal $DW_{14}$ of counting circuit 14 is connected to receive the afore-mentioned signal (e) through a logic coincidence circuit 15 which represents a NAND-gate.

When the number of signal pulses (i) is equal to the number of pulses of signal (e), the counting circuit 14 is in equilibrium at its output terminals $A_{14}$ (not shown), $B_{14}$, $C_{14}$ and $D_{14}$. Consequently no signal is delivered at the last three output terminals, in particular.

However, when the number of signal pulses (i) is higher than the number of signal pulses (e), the counting circuit 14 is no longer in equilibrium at the above mentioned output terminals so that the counting is shifted in the forward direction. A logic coincidence circuit 16 representing a NAND-gate with three input terminals has these input terminals connected to outputs $B_{14}$, $C_{14}$ and $D_{14}$, respectively. The output level of logic circuit 16 becomes zero when the output terminals of circuit 14 are no longer in equilibrium and this output level is applied to the clear-input of a counter 17. The counting input of counter 17 is connected to the output terminal (S) of circuit 3 and therefore each pulse (S) delivered after the clearing of counter 17 is counted by the same. Counter 17 is adapted to emit a signal at the end of its counting a predetermined number of pulses, for instance 32. This end-signal appears at an output terminal $Q_{17}$ and is applied to the input of a monostable logic circuit 18 realised for instance as an integrated circuit of type 74 LS 221. Each end-signal pulse appearing at $Q_{17}$ therefore produces a signal pulse of given duration, for instance 4 microseconds at the output $Q_{18}$ of circuit 18. The signal appearing at $Q_{18}$ is applied to the reset input $CL_{14}$ of counter 14.

Furthermore, the signal delivered at output $D_{14}$ of counter 14 is applied through an inverter 20 and a logic circuit 19 (NAND-gate) to the blocking input $CL_3$ of the monostable logic circuit 3 and, through the said inverter 20, to one input of logic OR-gate 15, the other input of which receives signal (e).

The NAND-gate 19 further receives, on another input terminal than the one connected to inverter 20, the output signal of logic circuit 12.

Therefore, when the number of signal pulses (i) is higher by a few units only than the number of signal pulses (e), which might happen when noise pulses occur at point (a) of the circuit, counter 14 is rapidly again in equilibrium at its output terminals $B_{14}$ and $C_{14}$.

However, in the case the number of signal pulses (i) is substantially higher than that of the signal pulses (e), which might happen when the measuring pulses (S) and therefore the signal pulses (e) are not well synchronized with the tops of the watch movement, the counter 14 is automatically reset to zero when the counter 17 has reached the said predetermined number of input pulses (S), and as a result the measuring pulses are re-synchronized with the watch tops.

It is understood that the additional circuit of FIG. 3 is intended to be connected to the circuit of FIG. 1, if desired, the circuit parts designated by the same reference numbers and the connections designated by the same letters in FIG. 3 corresponding to those of FIG. 1.

I claim:

1. A device for measuring a characteristic magnitude of the operation of a timepiece movement, comprising means for detecting the vibrations produced by the operation of said movement, means for generating measuring pulses in response to said detected vibrations, means for preventing the generation of said measuring pulses during a blocking period which is a part of each time interval between two consecutive groups of vibrations produced by the operation of said movement in order to avoid the generation of said measuring pulses in response to undesired interfering noise vibrations, means for applying said measuring pulses to means for comparing the repetition frequency of said measuring pulses with the constant repetition frequency of clock pulses so as to produce an electric signal which is a measure of the said characteristic magnitude, and meter means adapted to receive said electric signal, said means for preventing the generation of said measuring pulses in response to said undesired interfering noise vibrations being adapted to start each blocking period immediately after the end of each said measuring pulse and to provide blocking periods which are each equal to the duration of the penultimate time interval between said measuring pulses preceding said blocking period, less a predetermined constant duration time window for said measuring pulse.

2. A device in accordance with claim 1, wherein the ratio between the said constant duration time window and the duration of the said time intervals between said measuring pulses is comprised between approximately 0.001 and 0.02.

3. A device in accordance with claim 1, wherein said means for preventing the generation of said measuring noise pulses during a blocking period include:

a first monostable logic circuit adapted to produce a first output signal in response to the output signal of said means for detecting the vibrations produced by the timepiece movement which first output signal comprises a series of square-wave pulses having a rising leading edge and being synchronized with the useful vibrations produced by the timepiece movement (hereinafter "tops"), and adapted to produce a second output signal which is inverted with respect to the first one and forms the desired said measuring pulses;

a second monostable logic circuit adapted to produce a third output signal in response to the first output signal, which third output signal comprises a series of square-wave pulses having a falling leading edge and being synchronized with the tops of the timepiece movement;

a third monostable logic circuit adapted to produce a fourth output signal in response to the third output signal, said fourth output signal comprising a series of square-wave pulses having a rising leading edge and being synchronized with the tops of the timepiece movement and shifted with respect to the third output signal pulses by a value equal to the duration of said third output signal pulses;

a fourth monostable logic circuit adapted to produce a fifth output signal in response to the fourth output signal, which fifth output signal comprises a series of square-wave pulses having a rising leading edge and being synchronized with the tops of the timepiece movement and shifted with respect to the fourth output signal pulses by a value equal to the duration of said fourth output signal pulses, and adapted to produce a sixth output signal which is inverted with respect to the fifth output signal;

a fifth monostable logic circuit adapted to produce a seventh output signal in response to the sixth output signal, which seventh output signal comprises a series of square-wave pulses having a rising leading edge, being synchronized with the tops of the timepiece movement and shifted with respect to the fourth output signal pulses by a value equal to the duration of said fourth output signal pulses;

a frequency divider receiving reference pulses of a constant frequency and delivering clock pulses, said frequency divider having a clear terminal connected to the output of the fourth monostable logic circuit to interrupt the delivery of the output signal of the divider during each output pulse of the fourth monostable circuit;

an up-counting pulse counter having its counting input connected to the output of the frequency divider and having a reset input connected to the output of the fifth monostable circuit to reset said counter after each output pulse of said fifth monostable circuit;

a memory circuit having a control input connected to the output of the third monostable circuit, which memory circuit is adapted to register the count of the up-counting pulse counter upon receipt of the output signal of said third monostable circuit;

a memory circuit having a control input connected to the output of the third monostable circuit, which memory circuit is adapted to register the count of the up-counting pulse counter upon receipt of the output signal of said third monostable circuit;

a down-counting pulse counter having its counting input connected to the output of said frequency divider and having an output terminal for delivering an end-signal when the count of the counter reaches zero, said counter further having a control terminal connected to the output of said second monostable circuit, the counter being adapted to register the state of the said memory circuit upon receipt of the output signal of said second monostable circuit;

a bistable logic circuit having a first input terminal connected to the output of the fourth monostable circuit and a second input terminal connected to the output of the down-counting counter delivering an end-signal and having its output connected to a reset input of said first monostable circuit so as to prevent the delivery of the output signal of said first monostable circuit during a time interval defined by the input pulses applied to the said first and second input terminals of the said bistable logic circuit.

* * * * *